United States Patent [19]
Eichfeld et al.

[11] Patent Number: 5,834,955
[45] Date of Patent: Nov. 10, 1998

[54] INTEGRATED CIRCUIT WITH MEMORY PROGRAMMABLE PAD DRIVER

[75] Inventors: Herbert Eichfeld; Heinz Mattes, both of Munich, Germany

[73] Assignee: Siemens Aktiengesellschaft, Munich, Germany

[21] Appl. No.: 752,372

[22] Filed: Dec. 4, 1996

[30] Foreign Application Priority Data

Dec. 8, 1995 [DE] Germany .................. 195 45 904.0

[51] Int. Cl.$^6$ ...................................... H03K 3/00
[52] U.S. Cl. ................. 327/108; 327/170; 327/564
[58] Field of Search ................... 327/108, 170, 327/564

[56] References Cited

U.S. PATENT DOCUMENTS

| | | | |
|---|---|---|---|
| 4,767,997 | 8/1988 | Nielsen | 328/108 |
| 5,600,271 | 2/1997 | Erickson et al. | 327/108 |
| 5,682,116 | 10/1997 | Dreibelbis et al. | 327/108 |
| 5,686,853 | 11/1997 | Lima et al. | 327/108 |
| 5,703,496 | 12/1997 | Sabin | 327/170 |

FOREIGN PATENT DOCUMENTS 42 00 680 A1  7/1993  Germany .
44 41 523 C1  5/1996  Germany .

OTHER PUBLICATIONS

Patent Abstracts of Japan, vol. 18, No. 22 (E–1490), Jan. 13, 1994 & JP 5–259765 A, Oct. 8, 1993.
Paper 33.3, 28th ACM/IEEE Design Automation Conference, Heinz Mattes et al, Propagation Delay Calculation for Interconnection Nets on Printed Circuit Boards by Reflected Waves, pp. 567–572.

*Primary Examiner*—Margaret Rose Wambach
*Attorney, Agent, or Firm*—Hill & Simpson

[57] ABSTRACT

The integrated circuit with programmable pad driver involves an integrated circuit (IS1) with at least one pad driver that has a programming unit (PE) and a plurality of sub-drivers (T1 . . . Tm). A specific driver intensity and edge steepness of the pad driver can be set in that a corresponding plurality of sub-drivers connected to a common terminal contact (PAD) at their output side are activated/deactivated dependent on output signals (P1 . . . Pm) of the programming unit.

13 Claims, 2 Drawing Sheets

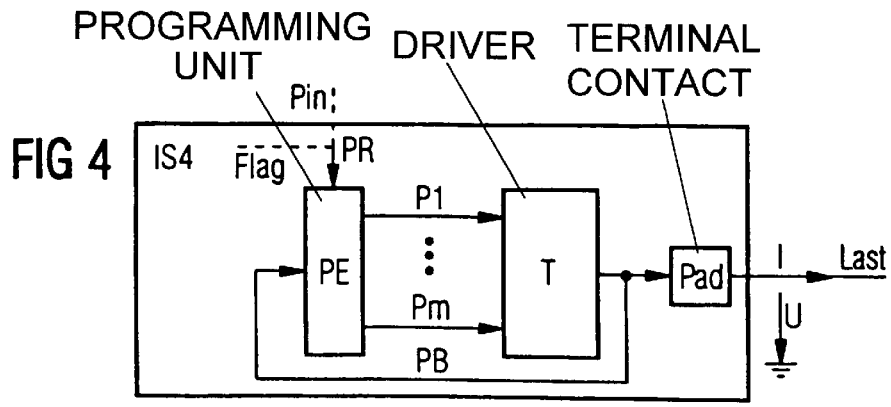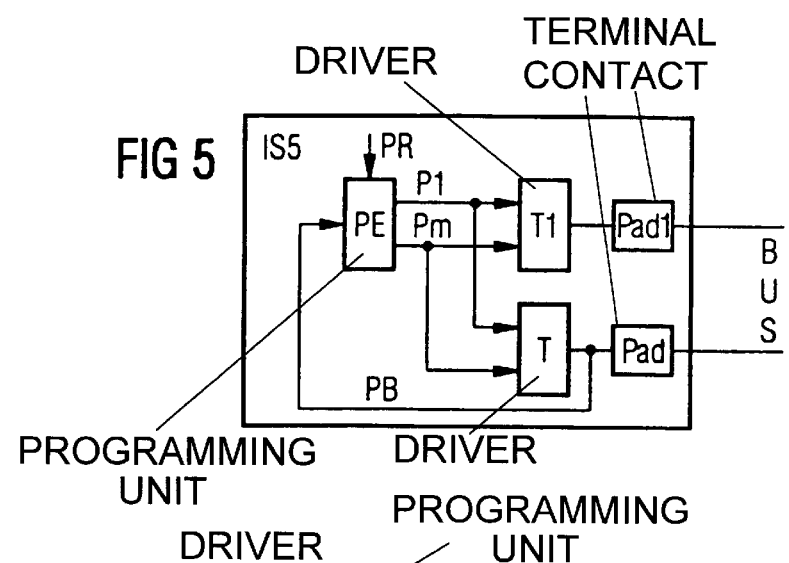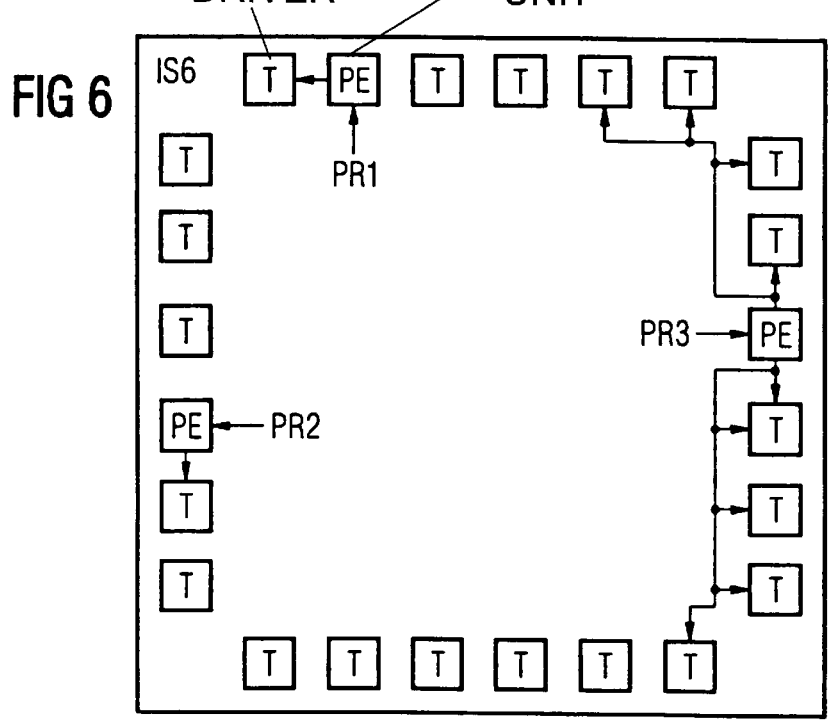

INTEGRATED CIRCUIT WITH MEMORY PROGRAMMABLE PAD DRIVER

BACKGROUND OF THE INVENTION

In order to enhance the electromagnetic compatibility (EMC) of integrated circuits, the pad drivers (terminal contact drivers) of integrated circuits must be matched to the external load in order, for example, to achieve "soft" voltage and current curves on the signal lines.

It is clear, for example from Paper 33.3 at the 28th ACM/IEEE Design Automation Conference, pages 567 through 572, that THE EMC-optimum driver does not exist for all load situations. On the contrary, the signal form depends both on the dimensioning of the driver, particularly on the driver intensity I in Amperes and the edge steepness dU/dt in V/sec, as well as on the type of load, for example a capacitative load, an open line or a line network. Since an integrated circuit is generally not utilized for only one specific application with a clearly defined load environment, an EMC-optimum dimensioning of the pad drivers is only possible for a particular application.

German Patent DE 44 41 523 C1 discloses a digital driver circuit for integrated circuits that can be matched to a load capacitance by adding a corresponding plurality of output branches. The driver circuit is relatively complicated since control means for the drive of the output branches, an input device for inputting a dimension value, a setting means for determining a manipulated quantity allocated to specific output branches on the basis of the dimension figure and a switch means for enabling the specific output branches are provided in addition to the output branches.

Further, German Published Application DE 42 00 680 A1 discloses a driver circuit wherein the edge steepness of the positive and negative signal edges is separately set with a plurality of sub-drivers.

SUMMARY OF THE INVENTION

It is an object of the present invention to provide an integrated circuit with a pad driver whose driver properties such as, for example, driver intensity I in Amperes and the edge steepness dU/dt in V/sec can be flexibly matched to a respective, external load, whereby optimally little additional chip area is required.

In general terms the present invention is an integrated circuit with at least one pad driver that has a programming unit and a plurality of sub-drivers. A specific driver intensity and edge steepness of the pad driver can be set in that a corresponding plurality of sub-drivers, which are connected to a common terminal contact at their output side, are activated/deactivated dependent on output signals of the programming unit. The programming unit has a memory whose output signals represent the output signals of the programming unit and whose serial input is connected to the common terminal contact. A programming bit signal is written into the memory dependent on a control signal. The programming unit is provided such that, due to the output signals of the programming unit, all sub-drivers are deactivated while the programming bit signal is being written into the memory.

Advantageous developments of the present invention are as follows.

The edge steepness of a positive signal edge is set separately from the edge steepness of a negative signal edge in that a first part of the plurality of sub-drivers is provided only for the positive signal edge and is activated/deactivated by first output signals of the programming unit and in that a second part of the plurality of sub-drivers is provided only for the negative signal edge and is activated/deactivated by first output signals of the programming unit.

A register at whose output the control signal depends is provided in the integrated circuit.

The control signal is externally supplied via a further terminal contact.

At least one further pad driver is provided that is driven by the output signals of the respective programming unit in common with the respective pad driver.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 4 is a block circuit diagram of a fourth embodiment of the present invention;

FIG. 5 is a block circuit diagram of a fifth embodiment of the present invention; and FIG. 6 is a block circuit diagram of a combination of various embodiments of the present invention.

DESCRIPTION OF THE PREFERRED EMBODIMENTS

Figure 1:
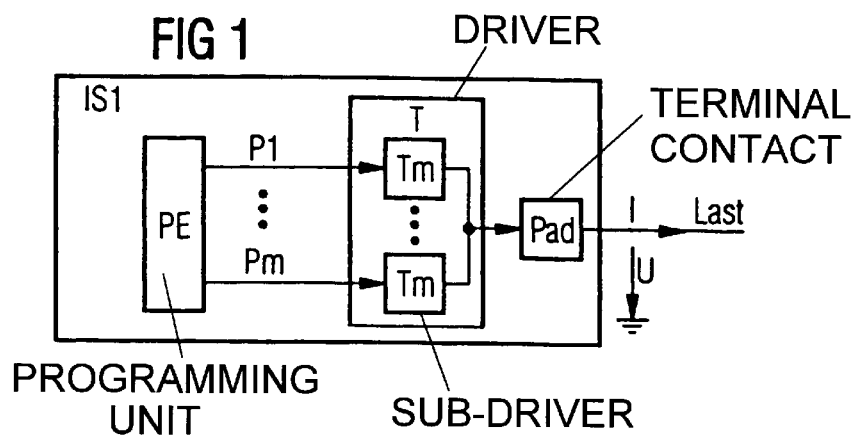
FIG. 1 is a block circuit diagram of a first embodiment of the present invention.

FIG. 1 shows a first embodiment IS1 of an inventive integrated circuit that has a programming unit PE, a driver T and a terminal contact PAD. A voltage U is present at the terminal contact PAD and a driver current I flows to the identically referenced load. The driver T is equipped with a plurality of sub-drivers T1 . . . Tm connected in parallel whose outputs are all connected to a common terminal contact PAD and that can be activated as needed using programming signals P1 . . . Pm from a programming unit PE. A deactivated sub-driver has a high-impedance at its output. The overall driver intensity I of the driver T is the sum of the driver intensities I1+I2. . . of all activated sub-drivers T1, T2 . . . The driver intensities of the individual sub-drivers thereby need not be uniformly distributed.

Figure 2:
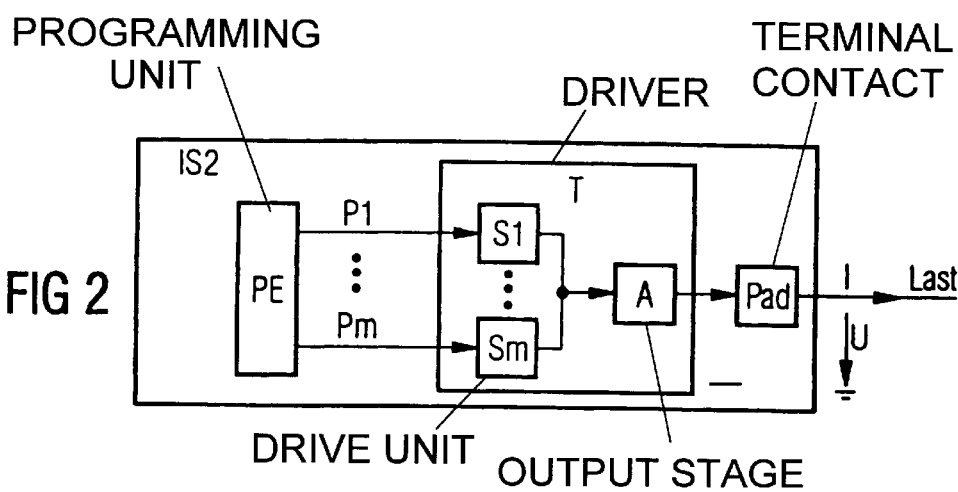
FIG. 2 is a block circuit diagram of a second embodiment of the present invention.

FIG. 2 shows a second embodiment IS2 of an inventive integrated circuit that essentially differs from the embodiment IS1 shown in FIG. 1 only in that the driver T is equipped with only one output stage A and a plurality of drive units S1 . . . Sm preceding the output stage. The output of the output stage A is connected to the terminal contact PAD. The respective inputs of the respective drive units are activatable as needed via programming signals P1 . . . Pm from a programming unit PE. The dimensioning of A thereby essentially defines the static driver intensity I, but the dimensioning of the drive units determines the edge steepness dU/dt. Accordingly, the edge steepness of the driver T can be set via the parallel connection of a plurality of drives S1 . . . Sm.

Figure 3:
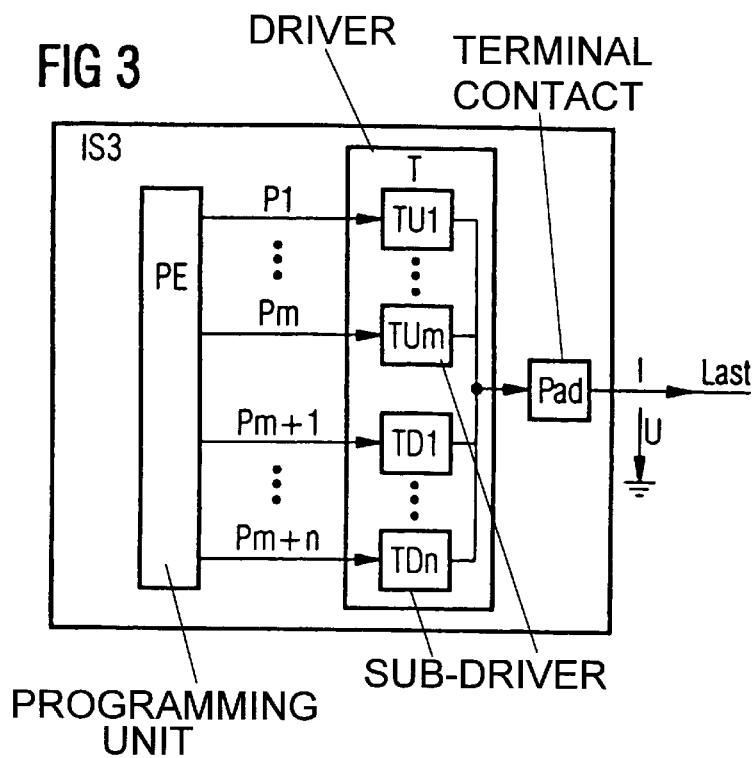
FIG. 3 is a block circuit diagram of a third embodiment of the present invention.

FIG. 3 shows a third embodiment IS3 of an inventive integrated circuit that essentially differs from the embodiment IS1 in FIG. 1 in that the driver T has sub-drivers TU1 . . . TUm for charging the load and sub-drivers TD1 . . . TDn for discharging the load, as a result whereof the positive edge and the negative edge of the output signal can be optimized independently of one another in view of the EMC. The sub-drivers TU1 . . . TUm are thereby activated or, respectively, deactivated by the programming signals P1 . . . Pm and the sub-drivers TD1 . . . TDm are activated or, respectively, deactivated by further programming signals Pm+1 . . . Pm+n.

Furthermore, arbitrary combinations of the features of the first through third embodiment are possible.

The programming of the programming unit PE can already be implemented by the manufacturer of the integrated circuit, for example as a mask-programmable ROM, or can be implemented by the motherboard developer, as indicated in FIGS. 4 and 5.

FIG. 4 shows a fourth embodiment IS4 of an inventive integrated circuit that essentially differs from the embodiment IS1 in that a programming bit PB for programming the programming unit PE can be supplied to the programming unit PE via the terminal contact PAD. The programming unit PE can be driven by a control signal PR from a control register FLAG or an additional terminal PIN.

So that the programming can be implemented by the motherboard developer, the driver must support a programming mode. When only the programming of an individual pad driver is considered first, then the programming mode can be initiated by the control signal PR. The programming unit PE accepts the first programming bit PB via the terminal contact PAD for, for example, PR=1. At the same time, the programming signals P1 . . . Pm deactivate the driver T. Subsequently, PR=0. The next programming bit is transmitted to PE given the next PR=1. A particular advantage is comprised here in the space-saving programming method.

FIG. 5 shows a fifth embodiment IS5 of an inventive integrated circuit that essentially differs from the embodiment IS4 in that at least one respective, further driver T1 is provided that is likewise driven with the programming signals P1 . . . Pm, and that is connected to at least one further terminal contact PAD 1. However, it has no connection between the terminal contact PAD and the programming unit PE. Since only those pad drivers of the integrated circuit that drive dynamic output signals, for example addresses or data, must be optimizable to EMC, only a subset of all drivers needs a programming unit. When the load conditions of an address bus or data bus are similar for all lines, then all appertaining pad drivers can be identically programmed with respect to the EMC. The programming bit PB can thereby be optionally supplied from any one of the terminal contacts PAD.

FIG. 6 shows a sixth embodiment IS6 of an inventive integrated circuit that represents a combination of the drivers shown in FIGS. 1–5, whereby pad drivers T without appertaining programming unit PE, various pad drivers T with separate programming unit and groups of pad drivers with shared programming unit are present. This makes different programming signals PR1 . . . PR3 necessary.

The programming unit PE is integrated on an inventive integrated circuit where there are often gaps, for example in the pad frame. The programming unit PE stores the logical status of the programming signals since these must be statically adjacent at the sub-drivers so that their scaling does not change during operation. The storing of the programming signals can ensue in a volatile memory, for example in a RAM or a flip-flop, but can also ensue in a non-volatile memory such as, for example, a ROM, OTP, EEPROM or fuse.

EMC rules for the programming of the programming unit PE are as follows. In order to keep the interference of signals as low as possible, fast, undesired amplitude changes that arise due to power reflections must be prevented insofar as possible.

First, the internal resistance of the signal source can be set by the dimensioning of the driver intensity (in Amperes) with a given operating voltage (in volts). The aim is that the differential internal resistance of the static output characteristics of the driver corresponds to the characteristic impedance of the connected line both for the "LOW" as well as for the "HIGH" level. Reflections at the signal source are prevented by this measure.

Second, the influence of the reflections arising at the line end can be set by the dimensioning of the edge steepness (in volts/second). The aim is that a line driven by a driver is "electrically short". This is achieved when the first wave reflected at the line end reaches the transmitter again before the leading/trailing edge has reached its ultimate value. In this case, the reflection (excited at the line end) is dominated and attenuated by the transmitter. The following rule derives therefrom: the rise/decay time should be greater than twice the delay time of the connected line.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An integrated circuit with at least one programmable pad driver, comprising:

a programming unit connected to a plurality of sub-drivers;

a specific driver intensity and edge steepness of the pad driver being settable by the plurality of sub-drivers connected to a common terminal contact at output sides thereof, the sub-drivers being activatable as a function of respective output signals of the programming unit;

the programming unit having a memory having output signals that represent output signals of the programming unit, the memory having a serial input connected to the common terminal contact, a programming bit signal being written into the memory dependent on a control signal; and the programming unit structured such that, due to the output signals of the programming unit, all sub-drivers are deactivated while the programming bit signal is being written into the memory.

2. The integrated circuit according to claim 1, wherein edge steepness of a positive signal edge is set separately from edge steepness of a negative signal edge in that a first part of the plurality of sub-drivers is provided only for the positive signal edge and is activated/deactivated by first output signals of the programming unit and in that a second part of the plurality of sub-drivers is provided only for the negative signal edge and is activated/deactivated by first output signals of the programming unit.

3. The integrated circuit according to claim 1, wherein the integrated circuit further comprises a register having an output at which the control signal pends.

4. The integrated circuit according to claim 1, wherein the control signal is externally supplied via a further terminal contact.

5. The integrated circuit according to claim 1, wherein the integrated circuit further comprises at least one further pad driver that is driven by the output signals of the respective programming unit in common with the respective pad driver.

6. An integrated circuit with at least one programmable pad driver, comprising:

a programming unit connected to a plurality of sub-drivers, the sub-drivers being activatable as a function of output signals of the programming unit;

the programming unit having a memory whose output signals represent the output signals of the programming unit, the memory having a serial input connected to the common terminal contact, a programming bit signal being written into the memory dependent on a control signal;

the programming unit structured such that, due to the output signals of the programming unit, all sub-drivers are deactivated while the programming bit signal is being written into the memory; and wherein edge steepness of a positive signal edge is set separately from edge steepness of a negative signal edge in that a first group of sub-drivers of the plurality of sub-drivers is provided only for the positive signal edge and is activatable by first output signals of the programming unit and in that a second group of sub-drivers of the plurality of sub-drivers is provided only for the negative signal edge and is activatable by first output signals of the programming unit.

7. The integrated circuit according to claim 6, wherein the integrated circuit further comprises a register having an output at which the control signal pends.

8. The integrated circuit according to claim 6, wherein the control signal is externally supplied via a further terminal contact.

9. The integrated circuit according to claim 6, wherein the integrated circuit further comprises at least one further pad driver that is driven by the output signals of the respective programming unit in common with the respective pad driver.

10. An integrated circuit with a plurality of programmable pad drivers, comprising:

each pad driver of the plurality of pad drivers having a programming unit and a plurality of sub-drivers;

for each pad driver of the plurality of pad drivers specific driver intensity and edge steepness being settable by the plurality of sub-drivers connected to a common terminal contact at output sides thereof, the sub-drivers being activatable as a function of output signals of the programming unit;

for each pad driver of the plurality of pad drivers the programming unit having a memory whose output signals represent the output signals of the programming unit, the memory having a serial input connected to the common terminal contact, a programming bit signal being written into the memory dependent on a control signal; and for each pad driver of the plurality of pad drivers the programming unit structured such that, due to the output signals of the programming unit, all sub-drivers are deactivated while the programming bit signal is being written into the memory; and a first pad driver of the plurality of pad drivers being driven by output signals of its respective programming unit in common with a second pad driver of the plurality of pad drivers.

11. The integrated circuit according to claim 10, wherein edge steepness of a positive signal edge is set separately from edge steepness of a negative signal edge in that a first part of the plurality of sub-drivers is provided only for the positive signal edge and is activated/deactivated by first output signals of the programming unit and in that a second part of the plurality of sub-drivers is provided only for the negative signal edge and is activated/deactivated by first output signals of the programming unit.

12. The integrated circuit according to claim 10, wherein the integrated circuit further comprises a register having an output at which the control signal pends.

13. The integrated circuit according to claim 10, wherein the control signal is externally supplied via a further terminal contact.

* * * * *